US012684685B2

(12) United States Patent
Geng et al.

(10) Patent No.: US 12,684,685 B2
(45) Date of Patent: Jul. 14, 2026

(54) COOLING ASSEMBLY WITH DAMPENED OSCILLATION RESPONSE

(71) Applicant: Intel Corporation, Santa Clara, CA (US)

(72) Inventors: Phil Geng, Washougal, WA (US); Jeffory L Smalley, Olympia, WA (US); Sandeep Ahuja, Portland, OR (US); Ralph V. Miele, Hillsboro, OR (US); David Shia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 17/555,250

(22) Filed: Dec. 17, 2021

(65) Prior Publication Data

US 2022/0117079 A1     Apr. 14, 2022

(51) Int. Cl.
*H05K 1/02*        (2006.01)
*H05K 1/181*      (2026.01)
*H05K 7/20*        (2006.01)

(52) U.S. Cl.
CPC ......... *H05K 1/0271* (2013.01); *H05K 1/0203* (2013.01); *H05K 1/181* (2013.01); *H05K 7/2039* (2013.01); *H05K 7/20509* (2013.01); *H05K 7/20709* (2013.01)

(58) Field of Classification Search
CPC .... H05K 1/0271; H05K 1/0203; H05K 1/181; H05K 7/2039; H05K 7/20509; H05K 7/20709; H05K 3/0061; H05K 1/0204; G06F 1/183; F16F 7/104
See application file for complete search history.

(56) References Cited

U.S. PATENT DOCUMENTS 6,212,074 B1 * 4/2001 Gonsalves .......... H01L 23/4275
                                                           174/16.3
6,557,675 B2 5/2003 Iannuzzelli
                        (Continued)

FOREIGN PATENT DOCUMENTS

GB            2576030           2/2020
GB            2576032           2/2020
                (Continued)

OTHER PUBLICATIONS

European Patent Office, "Extended European Search Report," issued in connection with 22206258.0, dated May 8, 2023, 10 pages.
(Continued)

*Primary Examiner* — Adam B Dravininkas
(74) *Attorney, Agent, or Firm* — Hanley, Flight & Zimmerman, LLC

(57)            ABSTRACT

An apparatus is described. The apparatus includes a semiconductor chip package assembly having a spring element to be coupled between a first mechanical element and a second mechanical element to apply a loading force that pulls the first and second mechanical elements toward each other in the assembly's nominal assembled state. The first and second elements to support a cooling mass, the assembly further comprising a dampener that is coupled to at least one of the first and second mechanical elements to reduce oscillation amplitude of the cooling mass.

18 Claims, 19 Drawing Sheets

(56) References Cited

U.S. PATENT DOCUMENTS

| | | | | |
|---|---|---|---|---|
| 6,809,937 | B2 * | 10/2004 | Augustin | H05K 3/301 |
| | | | | 361/810 |
| 9,681,556 | B2 | 6/2017 | Llapitan et al. | |
| 10,455,685 | B1 | 10/2019 | Klein et al. | |
| 10,622,279 | B1 | 4/2020 | Minawati et al. | |
| 10,811,800 | B1 * | 10/2020 | Blackburn | H01R 12/75 |
| 11,071,195 | B1 * | 7/2021 | Tong | H05K 1/0203 |
| 2002/0114137 | A1 * | 8/2002 | Pearson | H01L 23/4093 |
| | | | | 174/15.2 |
| 2002/0151195 | A1 * | 10/2002 | DiBene, II | G06F 1/189 |
| | | | | 257/E23.09 |
| 2003/0024781 | A1 | 2/2003 | Iannuzzelli | |
| 2003/0093897 | A1 * | 5/2003 | Augustin | H05K 3/301 |
| | | | | 29/841 |
| 2008/0165501 | A1 * | 7/2008 | Stewart | H01L 23/4006 |
| | | | | 361/704 |
| 2008/0197483 | A1 * | 8/2008 | Ouyang | H01L 23/4006 |
| | | | | 438/122 |
| 2014/0239488 | A1 * | 8/2014 | Kobayashi | H01L 23/367 |
| | | | | 257/718 |
| 2016/0183375 | A1 | 6/2016 | Krithivasan et al. | |
| 2018/0252483 | A1 * | 9/2018 | Geng | H01L 23/427 |
| 2019/0302857 | A1 | 10/2019 | Buddrius et al. | |
| 2020/0260613 | A1 * | 8/2020 | Winkel | H01L 23/473 |
| 2020/0335432 | A1 * | 10/2020 | Murtagian | H01L 21/67144 |
| 2021/0183737 | A1 | 6/2021 | Smalley et al. | |
| 2021/0193558 | A1 | 6/2021 | Miele et al. | |
| 2021/0307153 | A1 | 9/2021 | Mohammad et al. | |
| 2021/0320050 | A1 | 10/2021 | Robinson et al. | |
| 2021/0410317 | A1 | 12/2021 | Geng et al. | |
| 2022/0117079 | A1 | 4/2022 | Geng et al. | |

FOREIGN PATENT DOCUMENTS

| | | |
|---|---|---|
| GB | 2597525 | 2/2022 |
| GB | 2601357 | 6/2022 |

OTHER PUBLICATIONS

Geng, Phil, "Structural Design of Land Grid Array Loading Mechanisms for Intel Central Processor Unit Stack Retention", Journal of Electronic Packaging, Feb. 25, 2019, 8 pages, vol. 141, Copyright© 2019 by ASME, published online.

Starting on p. 4, paragraphs [0010] through paragraph [0023] only of the non-published U.S. Appl. No. 17/555,250, filed Dec. 17, 2021, pp. 4-6.

European Patent Office, "Communication Pursuant to Article 94(3) EPC," issued in connection with European Patent Application No. 22206258.0, dated Jul. 14, 2025, 7 pages.

European Patent Office, "Communication under Rule 71(3) EPC," issued in connection with European Patent Application No. 22206258.0, dated Feb. 10, 2026, 9 pages.

* cited by examiner

105

101

102

103

106

307

311

Damping elements 301

COOLING ASSEMBLY WITH DAMPENED OSCILLATION RESPONSE

BACKGROUND

System design engineers face challenges, especially with respect to high performance data center computing, as both computers and networks continue to pack higher and higher levels of performance into smaller and smaller packages. Creative packaging solutions are therefore being designed to keep pace with the thermal requirements of such aggressively designed systems.

FIGURES

FIGS. 1a, 1b, 1c, 1d, 1e, 1f, 1g, 1h and 1i pertain to a prior art cooling assembly;

FIGS. 2a, 2b, 2c, 2d and 2e pertain to an improved cooling assembly;

DETAILED DESCRIPTION

Figures 1A, 1B:
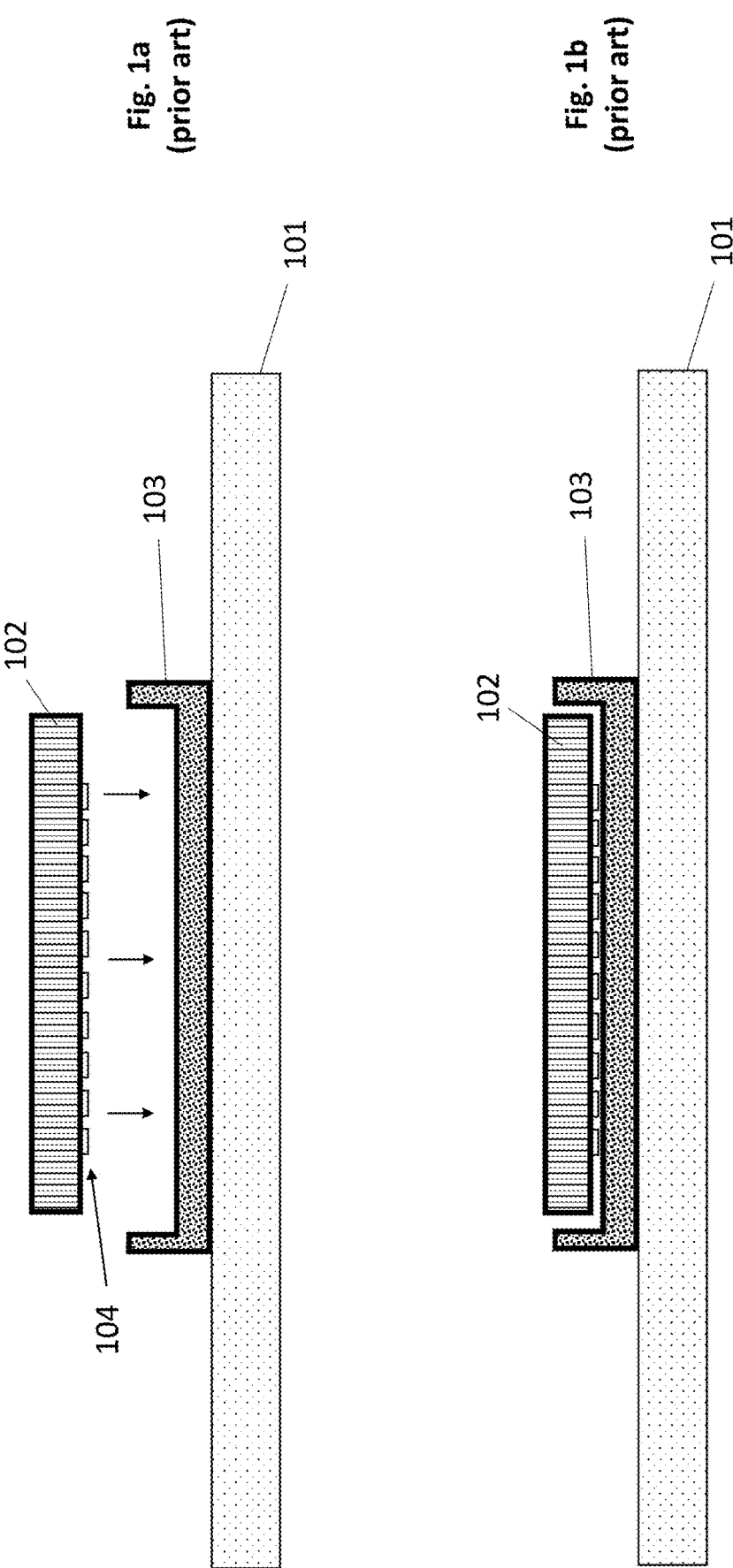

FIGS. 1a through 1h pertain to a heat sink assembly for a semiconductor chip package. As observed in FIGS. 1a and 1b, a packaged semiconductor chip 102 (or chips) is plugged into a socket 103 that is affixed to an electronic circuit board 101 (also referred to as a printed circuit (PC) board 101). Upon being plugged into the socket 103, the chip package 102 is mechanically and electrically coupled to the socket 103 (e.g., by way of a land grid array (LGA)). The socket 103, in turn, includes electrical structures that couple the chip package I/Os 104 to corresponding I/Os on the circuit board 104 (not shown in FIGS. 1a and 1b for illustrative ease).

Figure 1C:
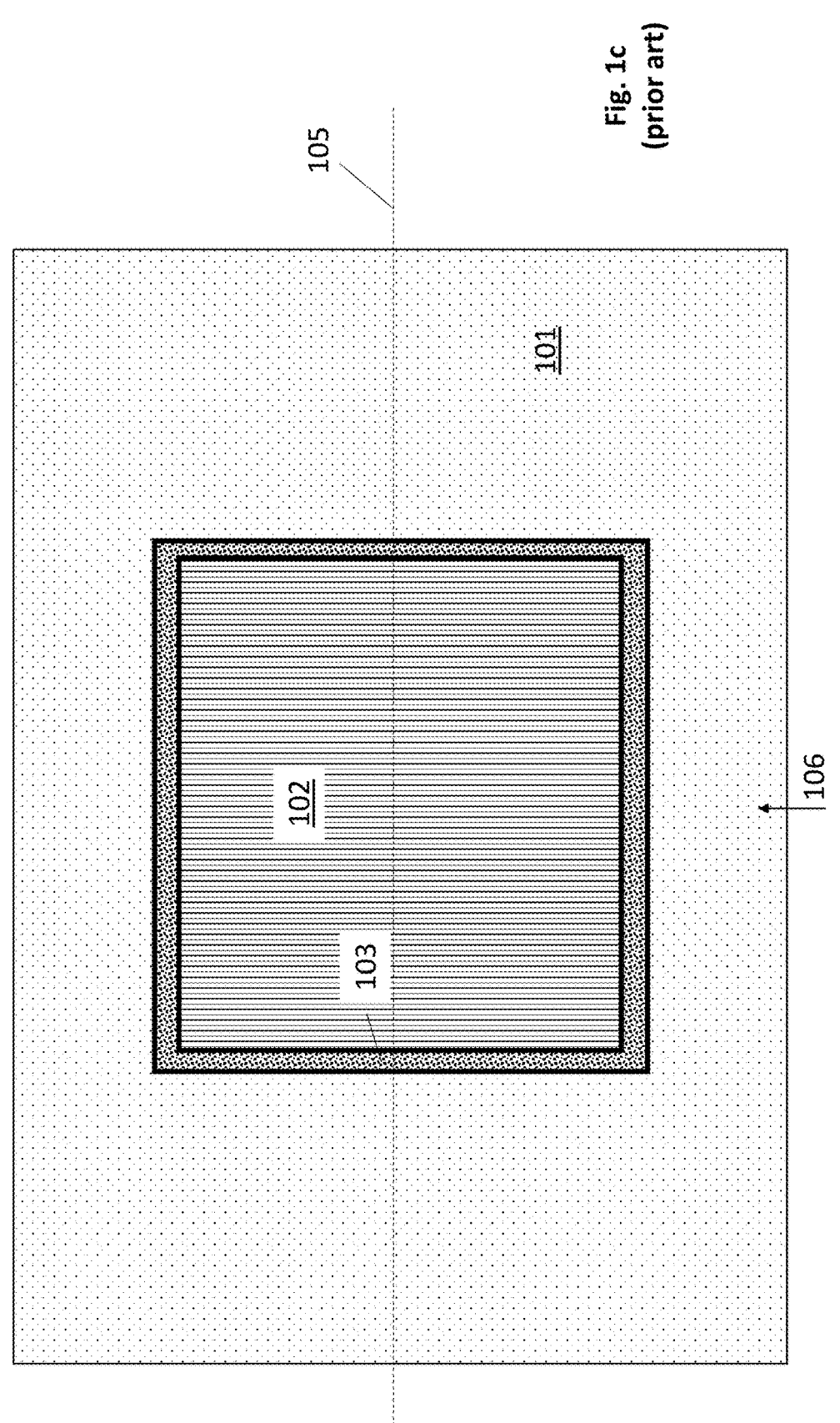
Figures 1D, 1E:
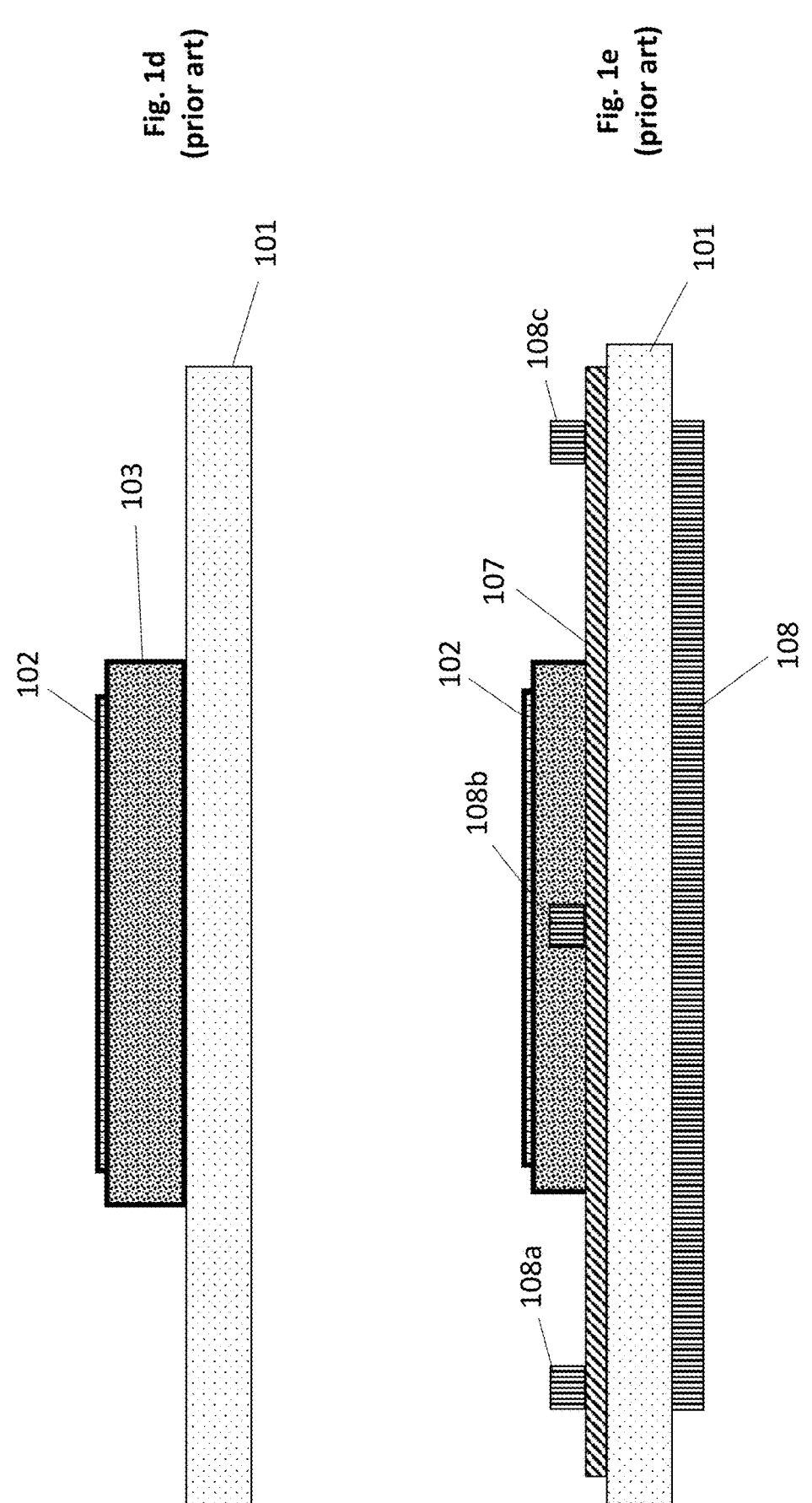

FIG. 1b shows a cross sectional view along axis 105 of FIG. 1c (which shows a top down view). FIG. 1d shows the same chip package 102 and socket 103 when viewed along ray 106 of FIG. 1c. Here, only the top surface of the chip package 102 is observed because the remainder of the chip package 102 is submerged into the well of the socket 103.

Figure 1F:
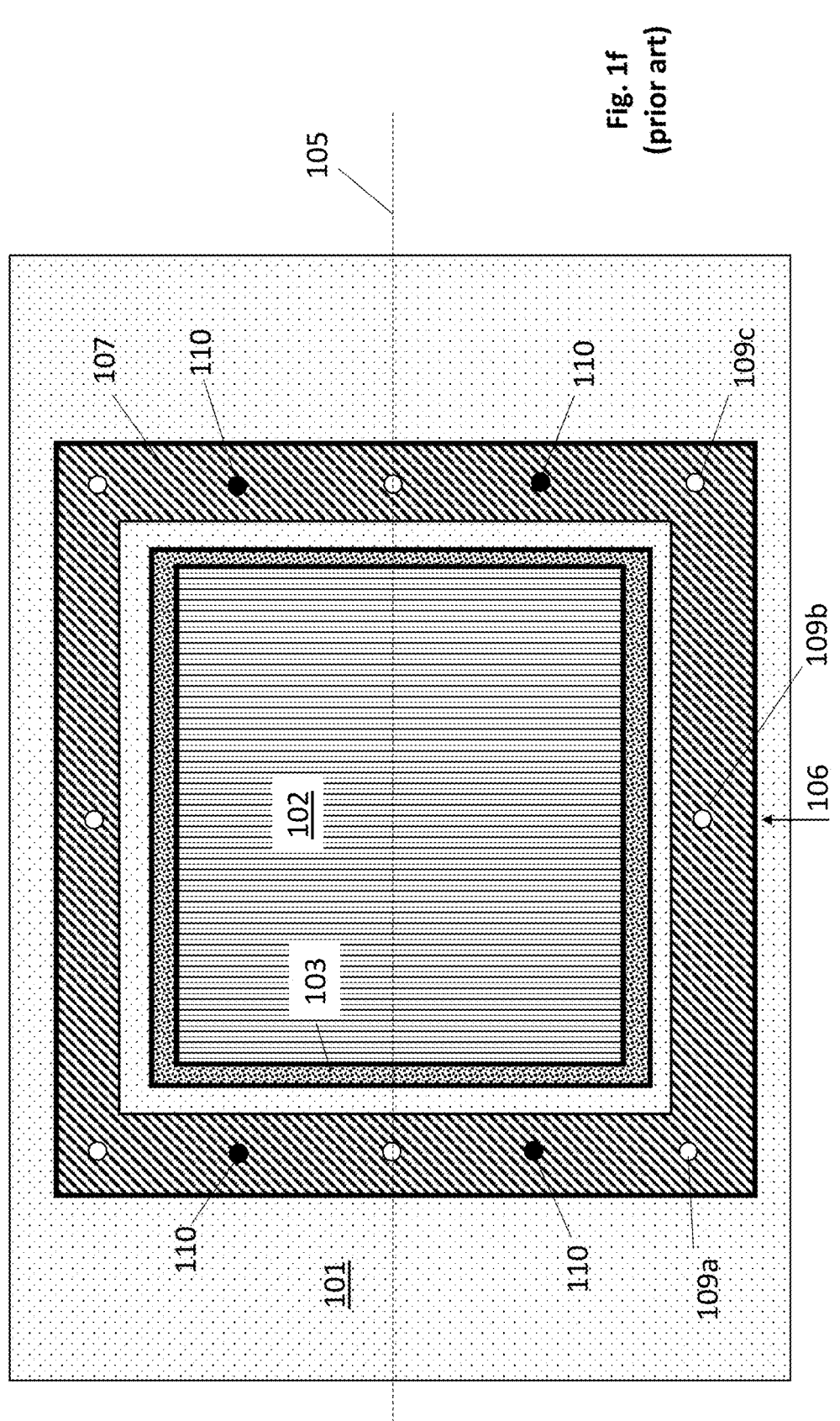

As observed in FIG. 1e, a bolster plate 107 is placed on the chip package side of the electronic circuit board 101 and a back plate 108 is placed on the opposite side of the electronic circuit board 101. A top down view of the bolster plate 107 is observed in FIG. 1f. As can be seen in FIG. 1f, the bolster plate 107 is a frame-like structure. The bolster plate 107 is positioned on the printed circuit board 101 such that the connector 103 is within the open space of the bolster plate 107.

Also, referring to FIGS. 1e and 1f, the back plate 108 has studs that are aligned with holes in the bolster plate 107. For example, studs 108a, 108b and 108c of FIG. 1e are aligned with holes 109a, 109b, 109c of FIG. 1f. For ease of drawing, only holes 109a, 109b, 109c of FIG. 1f are labeled because only studs 108a, 108b, 108c are observable from the side view of FIG. 1e. However, as suggested by FIG. 1f, similar studs and aligned holes exist around the periphery of the socket 103.

Referring to FIG. 1e, fixturing elements (e.g., screws, bolts, etc.) are then applied to the studs 108a,b,c and tightened to rigidly secure the bolster plate 107 to the back plate 108 (for ease of drawing the fixturing elements are not depicted).

Figure 1G:
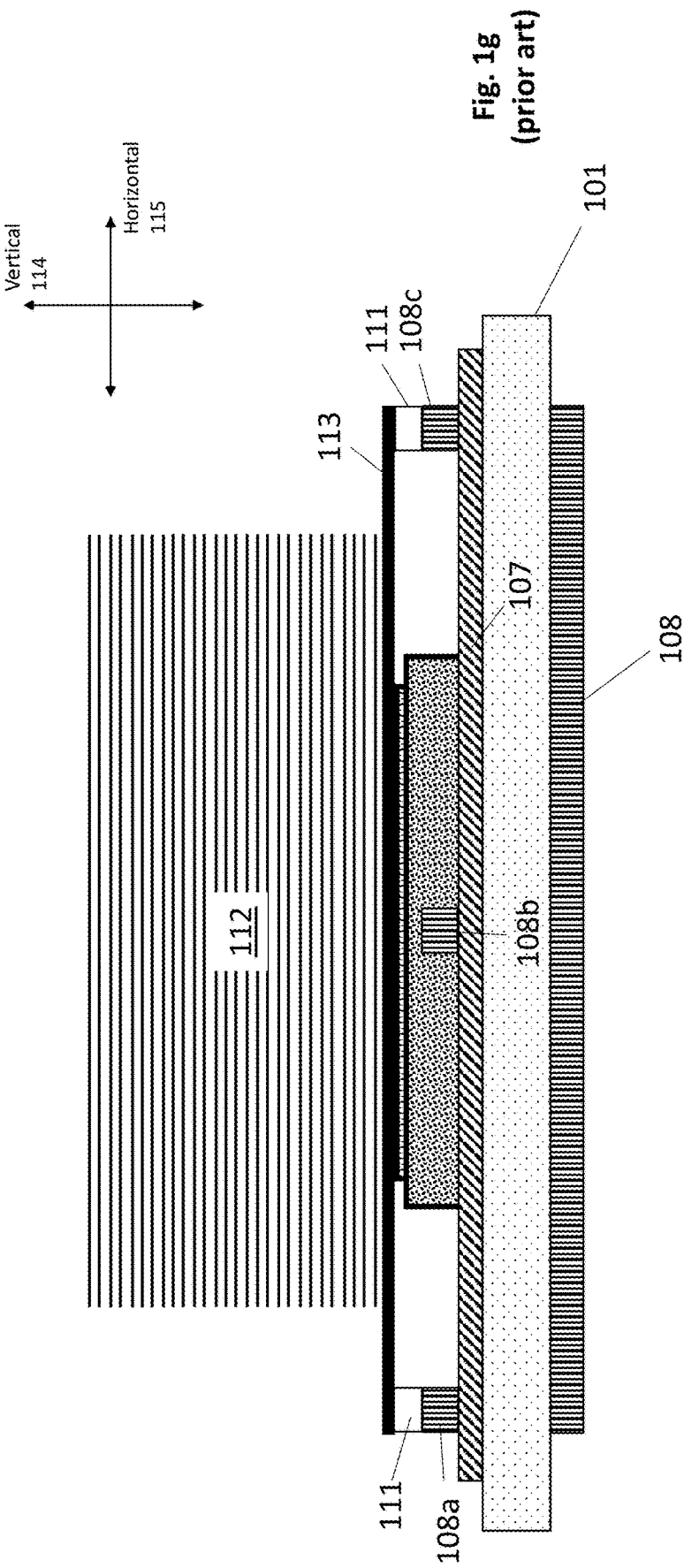

Then, as observed in FIG. 1g, a heat sink 112 having a base 113 is mounted to the bolster plate 107. Referring back to FIG. 1f, the bolster plate 107 also includes additional mechanical interfacing elements 110 (e.g., studs, mounts, holes, etc.) that are used to mount the heat sink base 113 to the bolster plate 107. The bottom of the heat sink base 113 has corresponding mechanical features to interface with the interface elements 110 (e.g., holes, receptors, studs, etc.).

Commonly, some kind of spring-loaded attachment hardware 111 is coupled between the bolster plate 107 (e.g., as part of the interfacing elements 110) and the heat sink base 113 to keep the heat sink base 113 in thermal contact with the semiconductor chip package 102 while supporting the weight of the heat sink 112 and base 113 through the bolster plate 107 (notably, attachment hardware 111 is behind studs 108a and 108c in the side view of FIG. 1g).

A potential problem is that future generations of silicon chip manufacturing technology will drive higher performance semiconductor chips characterized by increased transistor packing densities and corresponding increased amounts of dissipated heat and increased number of I/Os. Unfortunately, the increased heat dissipation combined with the increased number of I/Os creates packaging challenges that are best met through increased loading forces applied to the packaged semiconductor chip 102 and its cooling assembly.

Specifically, increasing the I/O count of the chip package 102 and socket 103 increases the propensity for the chip package 102 to "pop off" out of the socket 103. Here, the socket's I/O interface with the chip package 102 is composed of spring-like leads that exert considerable "push-back" against the chip package 102 when the chip package 102 is pressed into the well of the socket 103.

Additionally, the increased heat dissipation of future generation semiconductor chips drives larger and heavier heat sinks. Heavier heat sinks are more prone to cause damage to the chip package I/Os 104 through mechanical shock. For example, if the system that the assembly is integrated within is abruptly moved or shaken (e.g., during installation, by being dropped, etc.), some kinetic energy will be imparted to the heat sink 112.

A heavier heat sink 112, once in motion, will have a propensity to keep moving (via momentum). The propensity of the heat sink 112 to keep moving translates into movement of the chip package 102 within the socket 103, which, in turn, can damage the I/O connections between the chip package 102 and the socket 103.

Both of the above considerations (LGA push-back and heavier heat sink) drive the application of larger and larger assembly loading forces. That is, the greater the force by which the back plate 108, the bolster plate 107 and the base 113 of the heat sink 112 are compressed together, the better these challenges are overcome. Simply stated, the higher the loading forces, the more difficult it becomes for the chip package 102 to pop-out of the socket 103.

As mentioned above, application of a high loading force between the bolster plate 107 and the base 113 of the heat sink 112 is achieved with interfacing elements 110 and attachment hardware 111. Here, the interfacing elements 110 and/or attachment hardware 111 typically include some kind of spring-like mechanical element (spring element) that is compressed or stretched (depending on the particular mechanical design) when the heat sink base 113 is rigidly mounted to the bolster plate 107. Here, the term "spring element" can mean an actual spring (e.g., a coil spring) or other mechanical element designed to provide elastic resistance to some kind of movement (e.g., a metal tab, a metal finger, leaf spring, etc.).

Figure 1H:
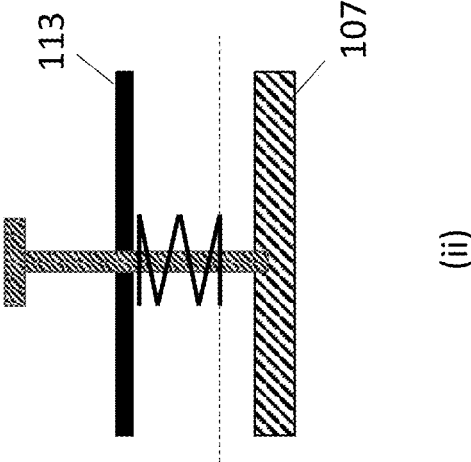
Figure 1H:
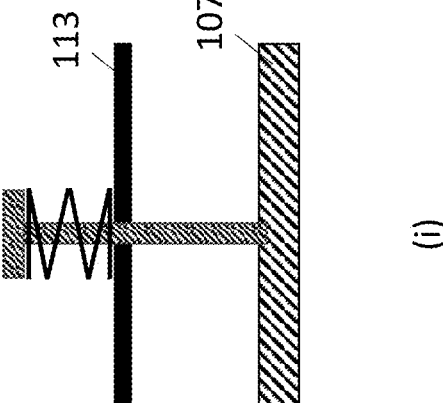

FIG. 1h shows a first design (i) in which a spring element is coupled to the head of a screw at one end and the top of the heat sink base 113 at the other end. As the screw is tightened into a threaded hole in the bolster plate 107, the head of the screw drives closer to the heat sink base 113 which increasingly compresses the spring. FIG. 1h also shows a second design (ii) in which the spring element is coupled to the bottom of the heat sink base 113 at one end and a fixed position 105 along the length of the screw at the other end. As the screw is tightened into a threaded hole in the bolster plate 107, the fixed position 105 of the screw 105 drives closer to the bolster plate 107 which increasingly stretches the spring.

The compression (i) or extension (ii) imparts potential energy into the spring element that causes the spring element to exert a resistive force that desires to return the spring element to its nominal (uncompressed/unstretched) shape. Both designs (i), (ii) are such that the resistive force pushes/pulls the base 113 of the heat sink and the bolster plate 107 towards one another after the screw is fully tightened (a condition referred to as "spring-loaded"). That is, the spring element resists the compression or extension, which, in turn, pulls the heat sink base 113 and bolster plate 107 toward one another. The stronger the resistive force, the greater the loading force between the heat sink base 113 and the bolster plate 107.

The spring element by its nature has some elasticity. In the event that the assembly is subjected to mechanical shock, the heat sink 112 is apt to exhibit some movement (albeit, the movement is limited because of the assembly's high loading forces). The movement can be along the vertical axis 114, the horizontal axis 115, or some combination of both. Unfortunately, the elasticity of the spring element causes the movement to oscillate.

Figure 1I:
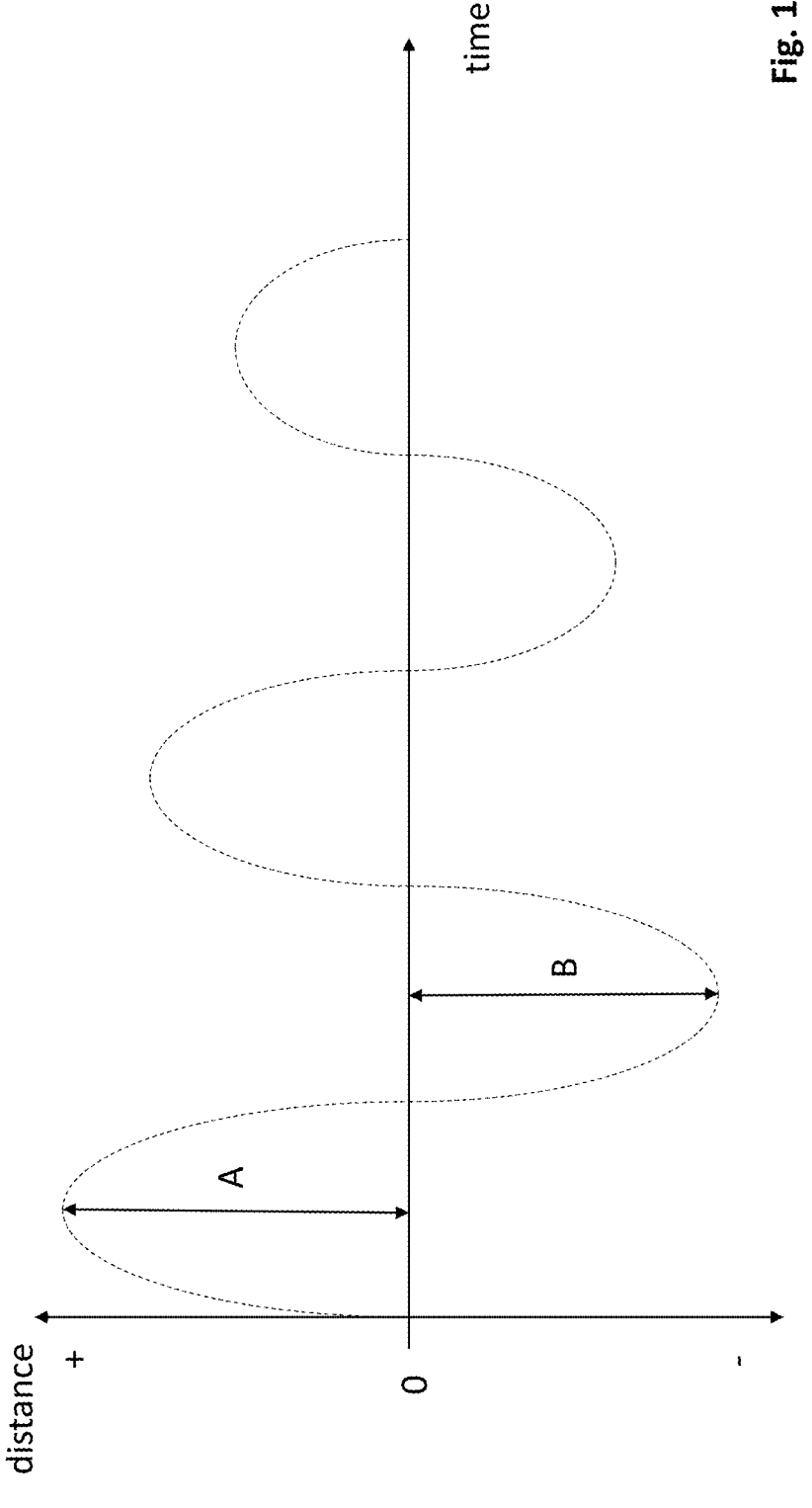

Here, referring to FIG. 1i, assume the initial shock causes the heat sink 112 to move some distance "A" in a positive direction that increases the spring's potential energy (e.g., the spring is further compressed in design (i) or is further stretched in design (ii)). The increase in potential energy, in turn, causes the spring element to exert even greater resistive force.

The elevated resistive force causes the heat sink 112 to "swing back" through its nominal position to another distance "B" in the opposite (negative) direction (e.g., relative to the assembly's nominal position, the spring element is less compressed in design (i) or less extended in design (ii)). The extension of the heat sink 112 a distance B in the negative direction causes the spring element to exert a reverse loading force that drives the heat sink 112 back in the positive direction. The heat sink 112 then continues to oscillate "back-and-forth" in positive and negative directions until the amplitude of the oscillation finally reduces to zero and the assembly settles to its nominal state.

The movements of the heat sink 112 translate to movements of the chip package 102 within the socket 103. Here, the "back-and-forth" movements, even though small, "scrape", "fret" or "groove" the I/O connections between the chip package 102 and the socket 103. Thus, a plurality of small motions can damage the I/Os similarly to one large motion.

A solution is to dampen the oscillation. Damping the oscillation reduces the amplitude of each oscillation cycle, which, in turn, corresponds to fewer meaningful back-and-forth motions (the number of motions that cause damage is reduced).

Here, as is known in the art, materials can be characterized by their elasticity and their viscosity. An elastic material has greater elasticity than viscosity and exhibits a largely in phase strain in response to an applied stress. Examples of elastic materials include high spring constant materials such as metals. By contrast, a viscous material has greater viscosity than elasticity and exhibits a largely out of phase strain in response to an applied stress. Examples of viscous materials include rubber, sorbothane, polymers and certain plastics.

The spring element that is designed into the interfacing elements 110 and/or attachment hardware 111 of the prior art assembly to impart high loading forces is elastic and is the source of the aforementioned oscillation. A damping element, by contrast, is viscous. Placing a damping element in parallel with a spring element will reduce oscillations caused by the spring element (the damping element's out-of-phase motions weigh on the spring element's in phase motions).

FIGS. 2a, 2b, 2c and 2d therefore pertain to an improved assembly that includes damping elements 201 (or "dampeners") inserted between the heat sink base 113 and the bolster plate 107 to dampen the mechanical oscillation described above. In various embodiments the damping elements 201 are composed of viscous materials such as rubber, sorbothane, polymer, plastic, cork and/or felt.

Figure 2A:
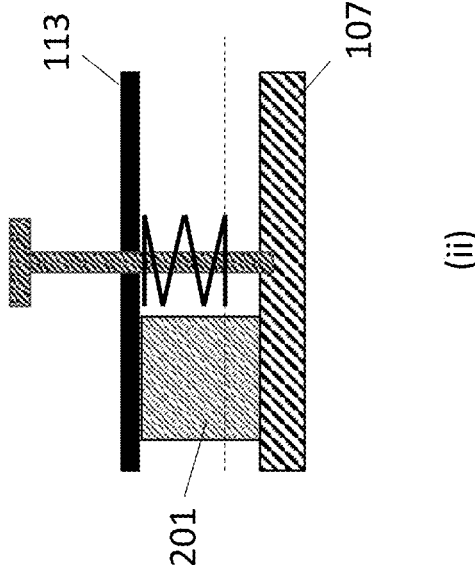
Figure 2A:
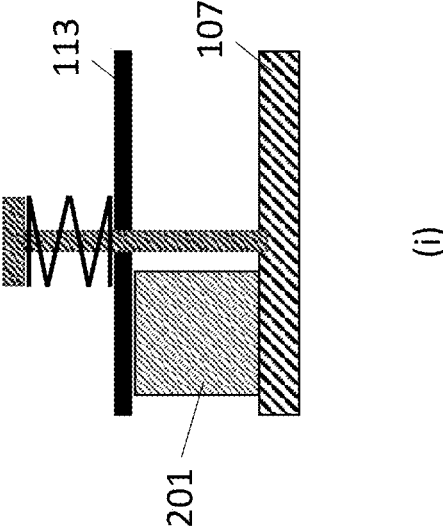

FIG. 2a shows the designs (i) and (ii) of FIG. 1h with a damping element 201 inserted between the heat sink base 113 and the bolster plate 107.

Figure 2B:
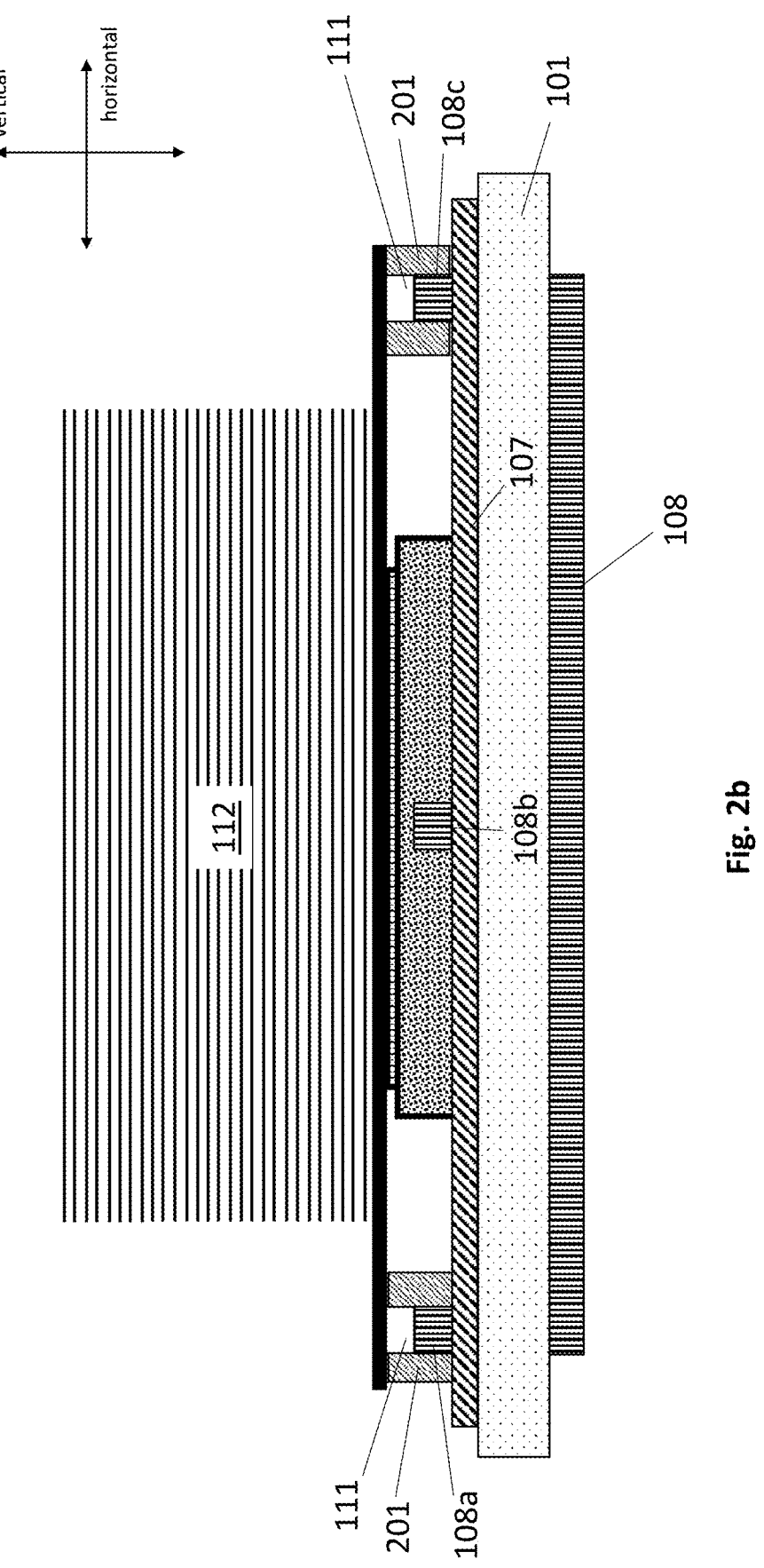
Figure 2C:
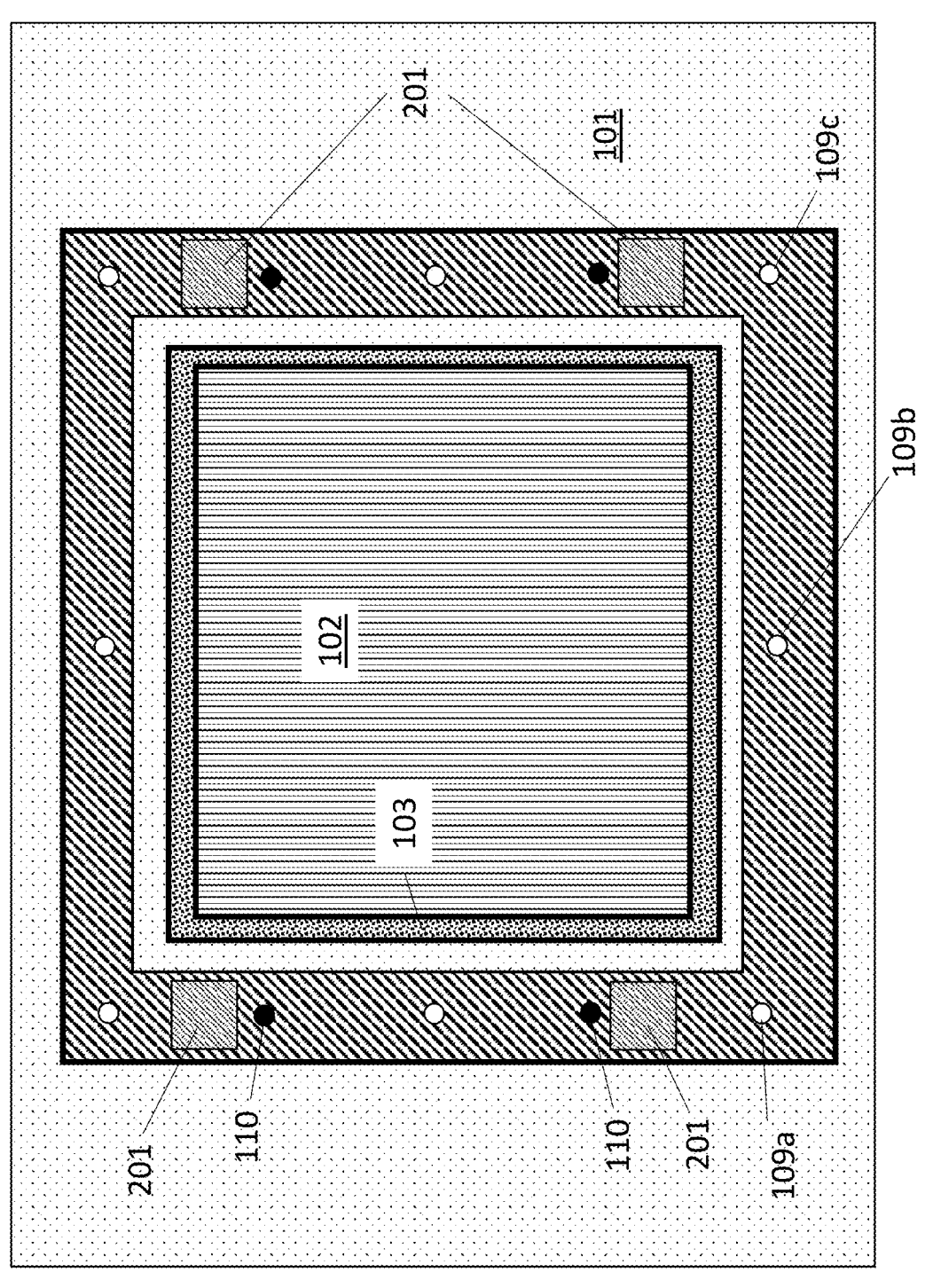
Figure 2D:
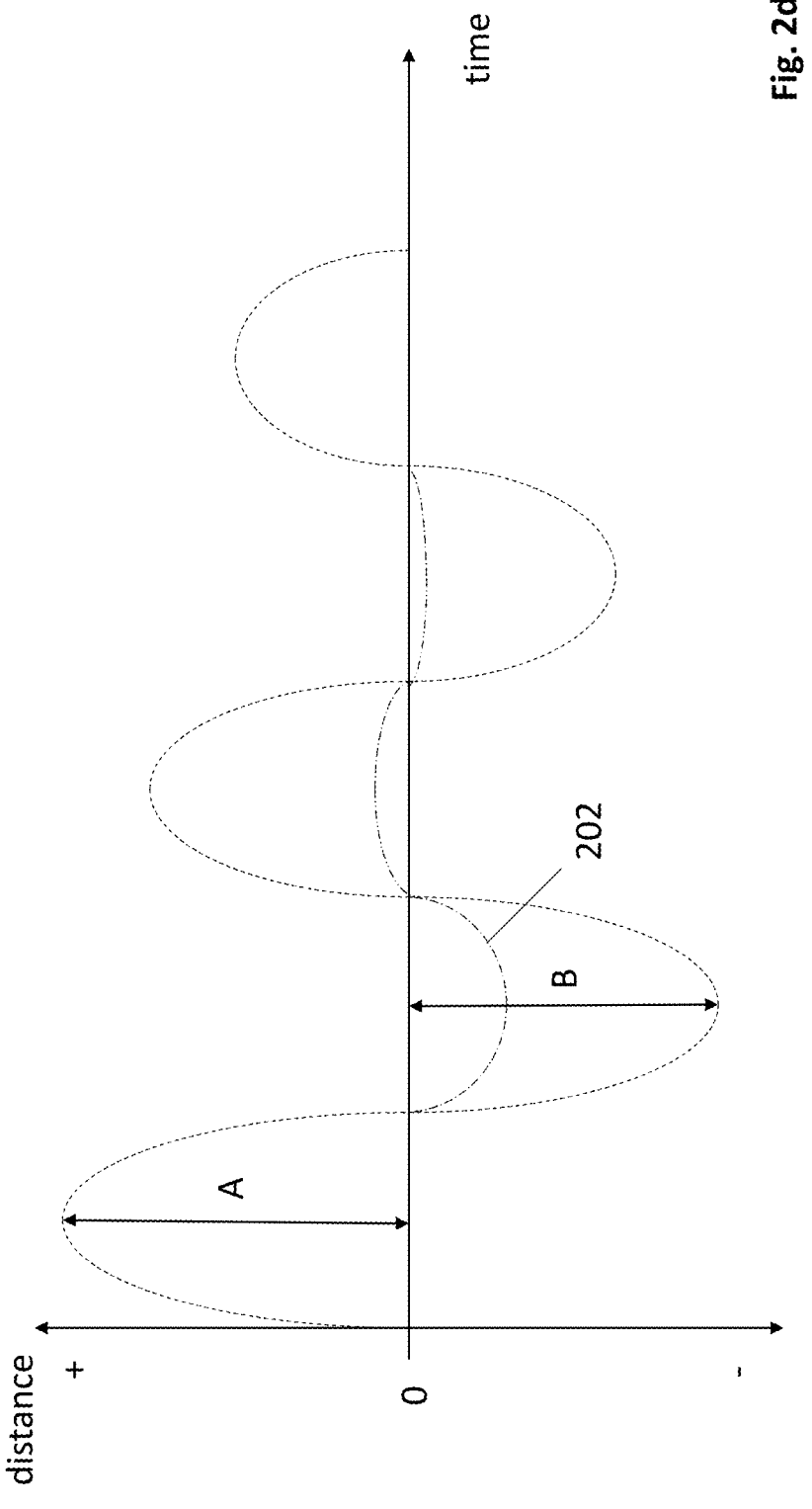

FIGS. 2b, 2c and 2d depict the prior art assembly of FIGS. 1(a)-(i) being improved through the addition of damping elements 201. As observed in FIGS. 2b and 2c, the damping elements 201 are secured (e.g., epoxied) to the bolster plate 107 and the heat sink base 113. In various embodiments, the presence of the damping elements 201 do not interfere with the loading of the assembly in its nominal state. Here, the damping elements 201 primarily dampen oscillatory motion of the heat sink and do not disturb the static loading force applied by the spring element 110, 111 when the assembly is in its nominal state.

FIG. 2d shows an exemplary oscillation response 202 with damping elements 201 in place. FIG. 2d also shows the undampened response of FIG. 1i for comparison. Here, for the sake of example, the initial shock causes the heat sink 112 and base 113 to move an initial distance A in the positive direction. The spring element causes the heat sink 112 and base 113 to be pulled back toward the bolster plate 107 with elevated force that would otherwise result in an extended throw in the negative direction as described above with respect to FIG. 1h (the force from the spring element is opposite to the heat sink's inertia and pulls the heat sink back).

However, upon the throw in the negative direction, the movement of the heat sink 112 and base 113 is resisted by the damping elements 201. Here, the force applied by the damping elements 201 is out of phase with both the inertia of the heat sink and the force applied to the spring element.

The resistance of the damping elements 201 cause the heat sink 112 and base 113 to extend only a fraction of the distance they would otherwise extend in the negative direction in the absence of the damping elements 201. Because the distance that the heat sink 112 and base 113 extend in the negative direction is greatly reduced as compared to the undampened approach, the spring element asserts significantly less force in the positive direction in response. As such, the amplitude of the next cycle of the oscillation in the positive direction is even more reduced than the undampened case.

Thus, the overall amplitude of the oscillation is greatly dampened per oscillation cycle which greatly reduces the number of effective oscillations that occur in response to the shock. Fewer effective oscillations correspond to less damage imparted to the I/O connections between the chip package 102 and the socket 103.

Note that if the initial shock causes the heat sink to move in a negative direction toward the damping elements 201 (instead of in a positive direction as in the above described example), the amplitude of the movement in the negative direction will be a fraction of A (rather than the full amplitude A).

In various embodiments, the damping elements 201 are wedges of viscous material. The wedges can be of various shapes such as cubes, rectangular blocks, cylindrical blocks having circular or elliptical faces, etc.

Figure 2E:
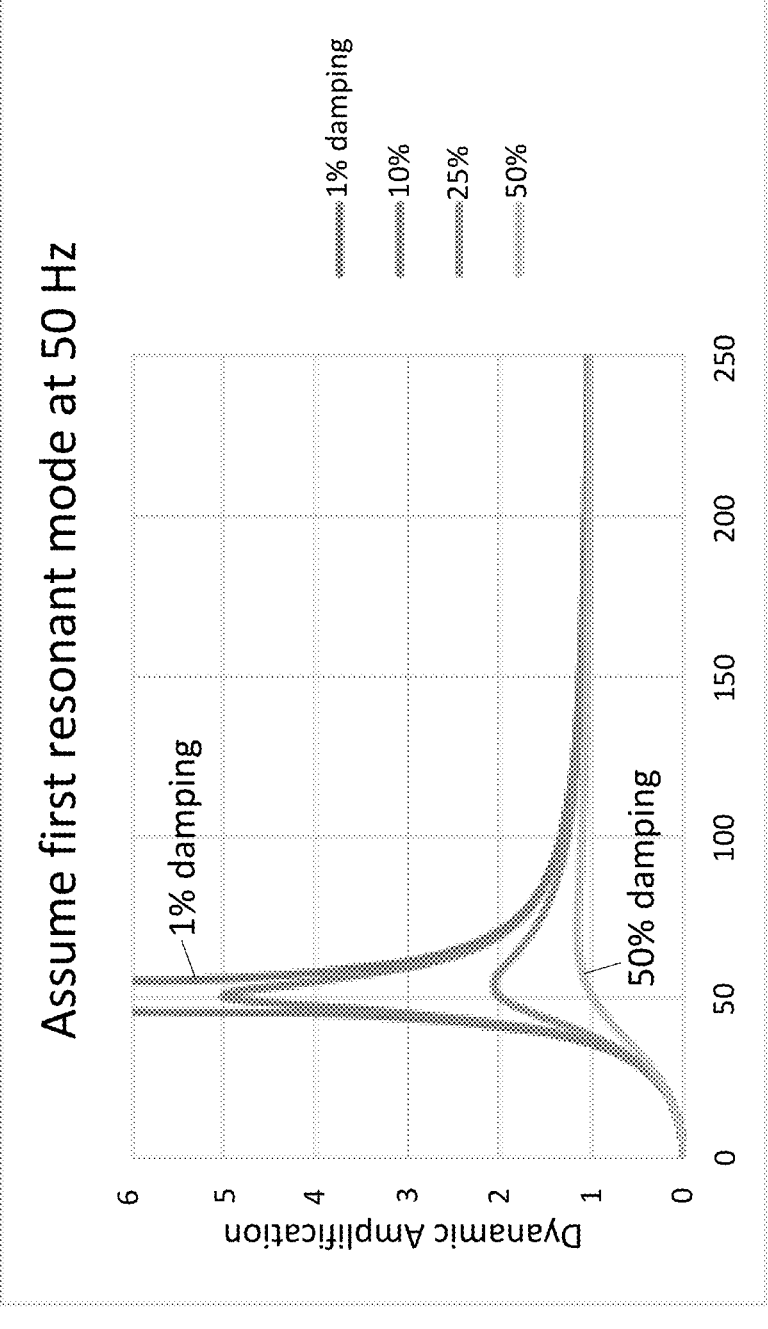

FIG. 2e shows exemplary oscillatory behavior as a function of applied vibration frequency with little/no damping (1%), severe damping (50%) and various amounts of damping in between. The large dynamic amplification observed with little/no (1%) damping in the frequency range of approximately 25 Hz to 75 Hz corresponds to the resonant frequencies that would result from a shock if dampeners were not integrated into the cooling assembly. By contrast, the severely dampened case (50%) shows that little/no resonant frequencies will result from such a shock if dampeners are integrated into the cooling assembly.

Figure 3:
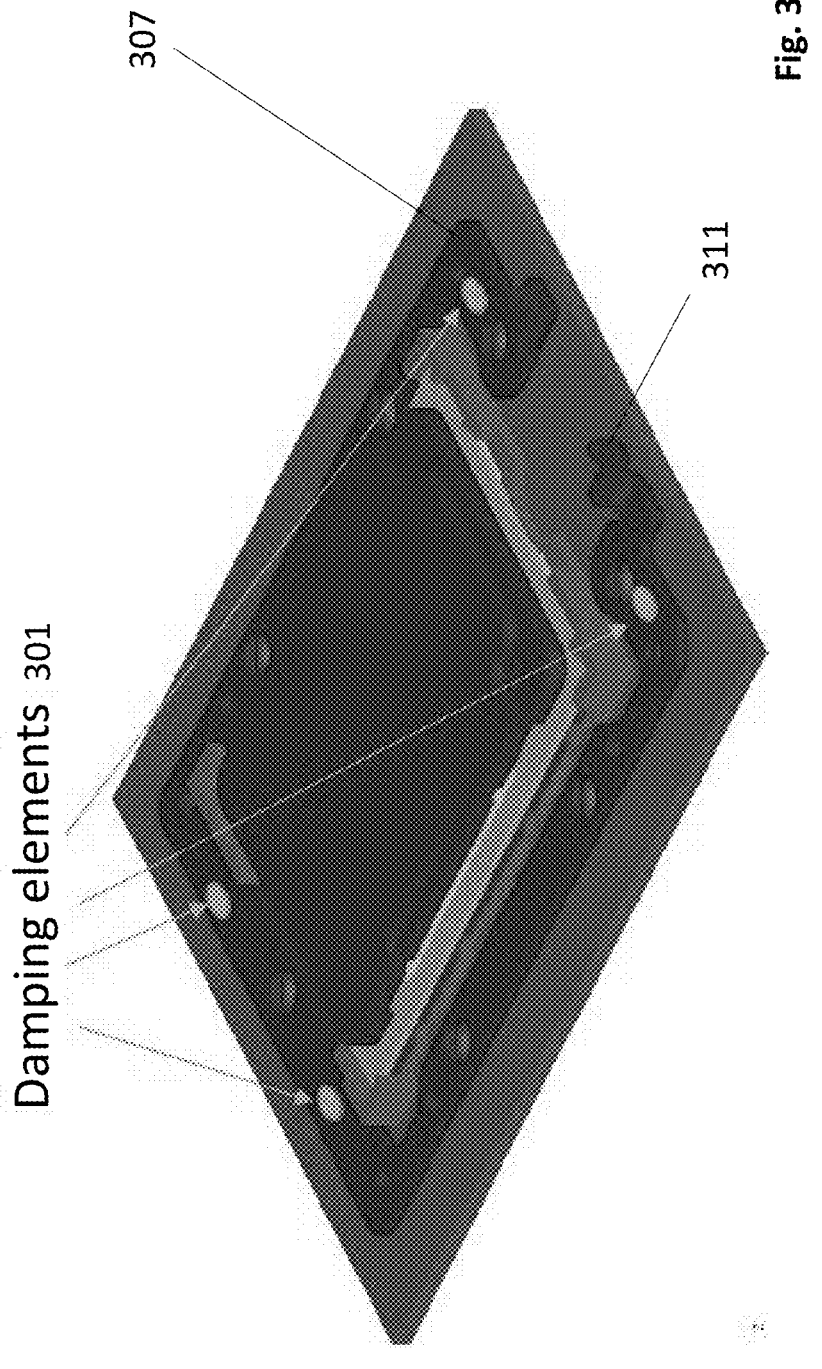
FIG. 3 shows a detailed embodiment of a bolster plate with damping elements.

FIG. 3 shows a more detailed embodiment of a bolster plate 307 and the corresponding damping elements 301. The damping elements 301 are, e.g., epoxied to the bolster plate 307. When the heat sink is added to the assembly, the damping elements are also epoxied to the underside of the heat sink base. The spring element is implemented as metal tab 311. The tab 311 bends in response to the securing of the bolster plate 307 to the base of the heat sink which provides the assembly's spring loading.

In other embodiments, e.g., to ease the difficulty of constructing the overall assembly with the damping elements, rather than securing all of the damping elements to both assembly features that the spring element is mechanically coupled to, some of the damping elements are secured to one of the assembly features (e.g., the bolster plate) while others of the damping elements are secured to the other of the assembly features (e.g., the heat sink base).

Figure 4A:
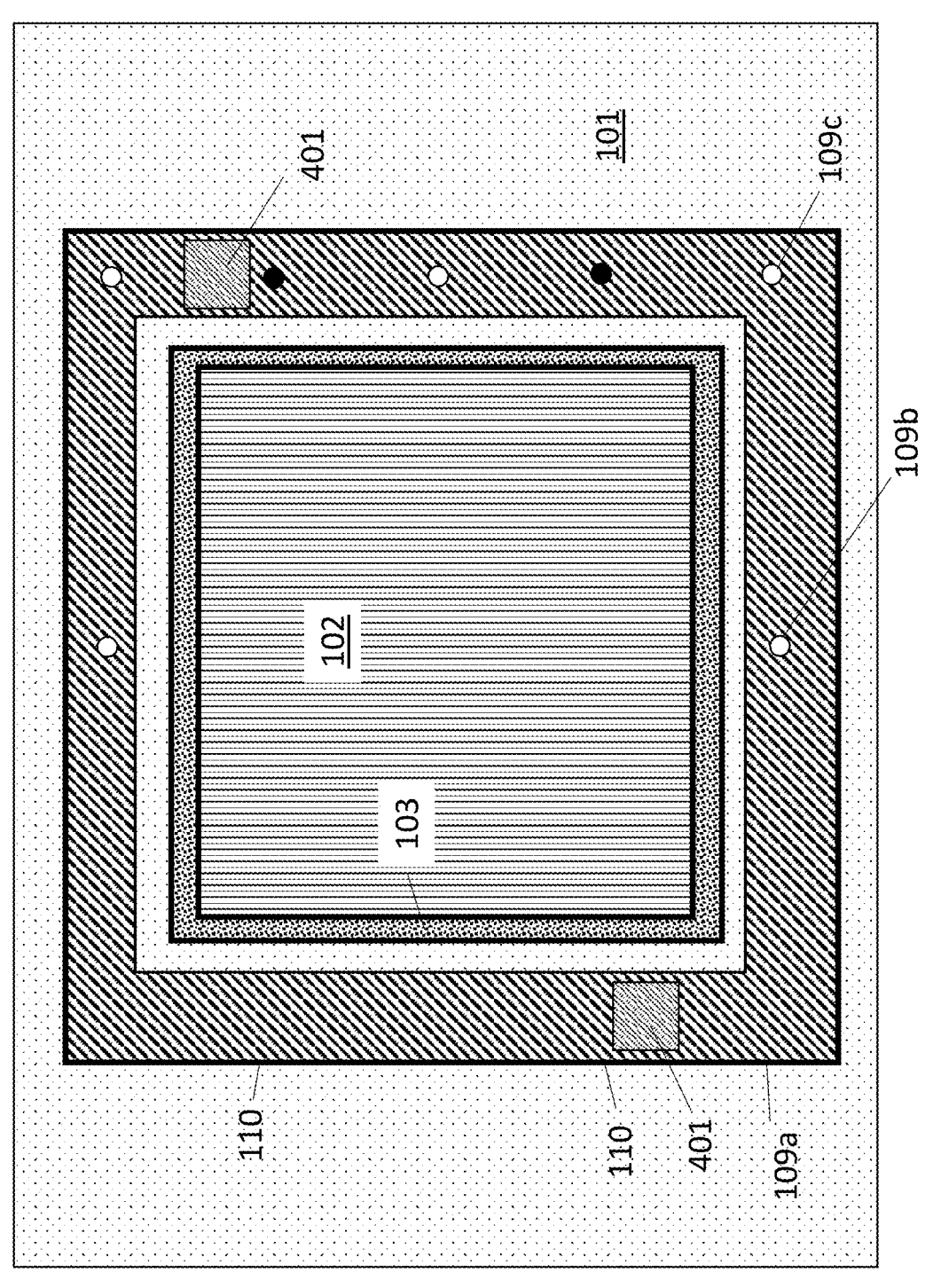
FIGS. 4a, 4b depict a damping element placement approach for a cooling assembly.
Figure 4B:
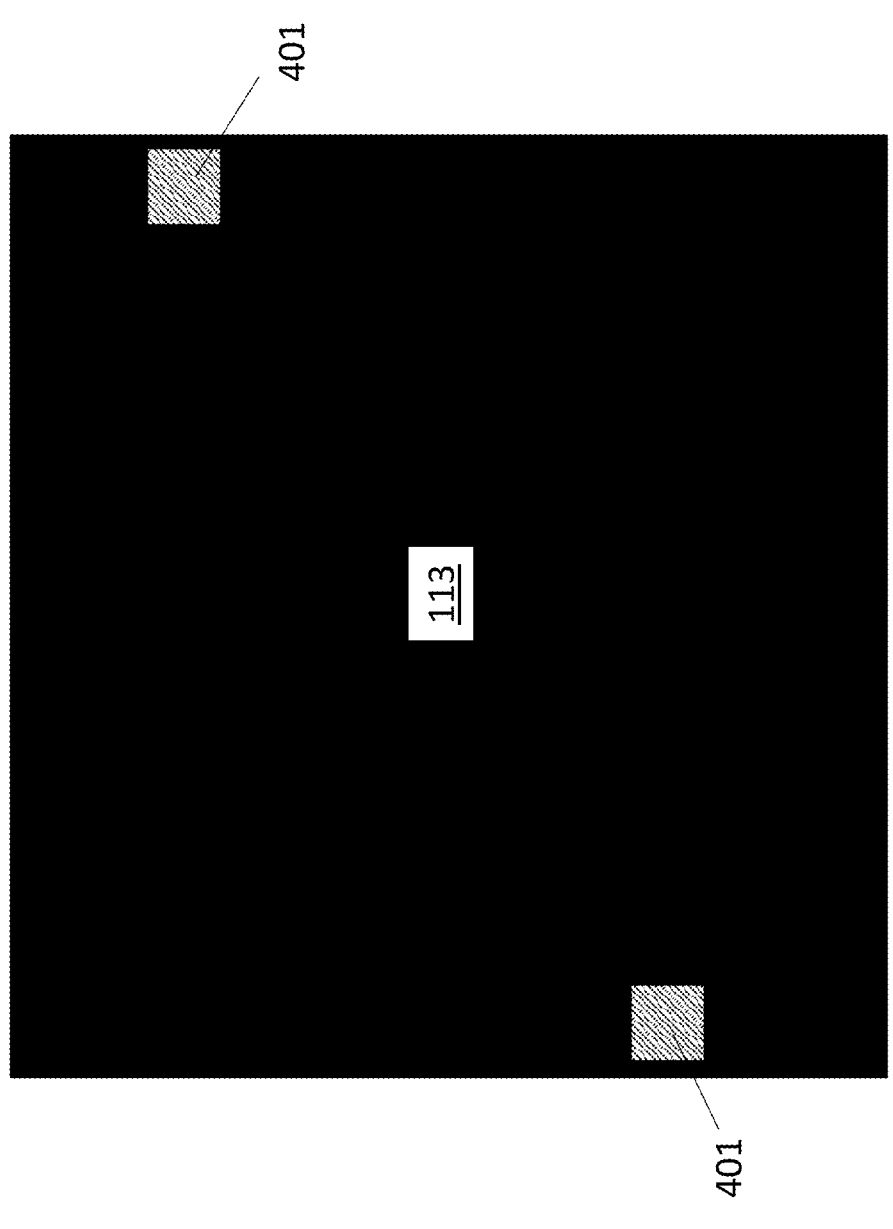

FIGS. 4a and 4b depict an example. FIG. 4a shows the top side of the bolster plate 107 and FIG. 4b shows the underside of the heat sink base 113. Comparing FIG. 4a with FIG. 2b, the upper left and lower right damping elements 201 that are secured to the bolster plate 107 in FIG. 2b are not secured to the bolster plate 107 in FIG. 4a. Instead, these damping elements are secured to the underside of the heat sink base 113 as observed in FIG. 4b. For example, the upper left and lower right damping elements are glued to the underside of the heat sink base 113 but are not glued to the bolster plate.

According to this arrangement, when the assembly is pieced together, the damping elements 401 on the underside of the heat sink base 113 in FIG. 4b will be aligned with the empty spaces where the damping elements 201 of FIG. 2b have been removed from the bolster plate 107 of FIG. 4a. The presence of damping elements 401 on the upper surface of the bolster plate 107 and other damping elements 401 on the underside of the heat sink base 113 will cause oscillation to be resisted in both directions (positive and negative) which is mechanically equivalent to implementations where the damping elements are secured to both features.

Note that although the specific examples above are directed to assemblies where the spring elements and damping elements are placed in between a bolster plate and a heat sink base, the principles described herein can be applied to other, different cooling assemblies that apply loading forces through a spring element to a different set of assembly structures. For example, the teachings above can be applied to cooling assemblies that attach one or more spring elements to the base of a heat sink and some structure in the assembly other than a bolster plate (e.g., the back plate, a chip carrier, etc.). In such embodiments, damping elements would be secured to at least one of these structures.

Notably, in various embodiments, the dampening elements are separate, discrete pieces of viscous material that are specially inserted into a complete and working cooling assembly in parallel with the assembly's spring loading elements. As such, the present teachings can improve many already existing cooling assemblies. To the extent such complete and working assemblies exhibit oscillation without the added dampening elements, to be technically precise, such oscillations are also dampened somewhat (the oscillations eventually cease). Nevertheless, such oscillations are not dampened enough. The addition of the dampening elements increases the already existing (but insufficient) dampening in the assembly. Thus, the improved cooling assembly with the extra added discrete dampening elements exhibits more dampening (fewer damaging oscillations) than the complete and working cooling assembly that remains when the separate, discrete dampening elements are removed.

In still other embodiments, the heat sink is replaced with a cold plate or vapor chamber for liquid cooling. In the case of a cold plate, cooled fluid is routed through the cold plate to absorb and remove heat generated by the semiconductor chip(s) in the chip package 102. In the case of a vapor chamber, liquid within the vapor chamber absorbs heat generated by the semiconductor chip(s) in the chip package 102 which, in turn, causes vaporization of the liquid. The vapor is then vaporized and condensed back to liquid to remove the heat generated by the semiconductor chip(s).

Figure 5:
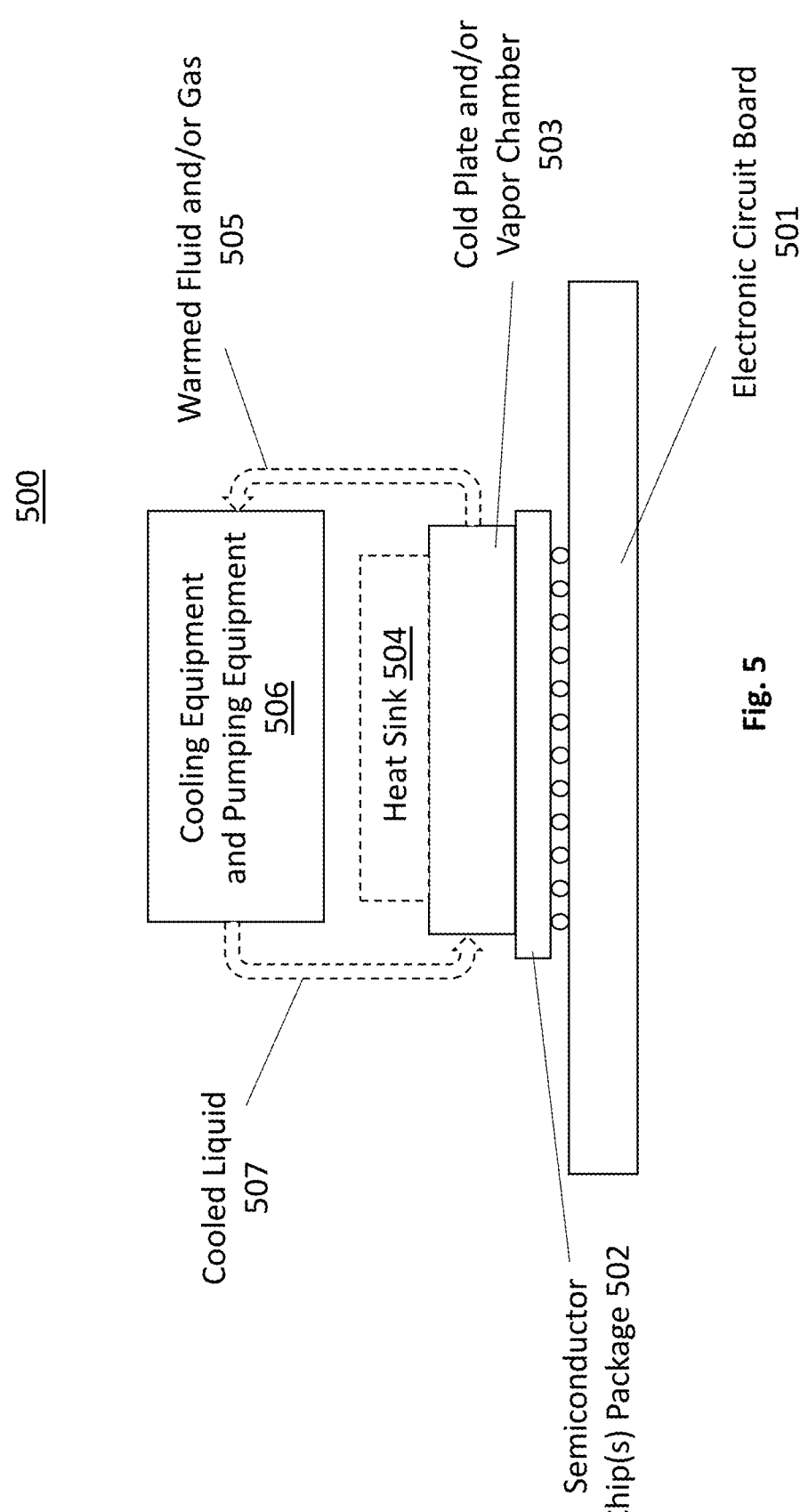
FIG. 5 shows a liquid cooling system.

As such, the teachings above can be applied to the cooling apparatus 500 of FIG. 5. FIG. 5 depicts a general liquid cooling apparatus 500 whose features can be found in many different kinds of semiconductor chip cooling systems. As observed in FIG. 5, one or more semiconductor chips within a package 502 are mounted to an electronic circuit board 501. A cold plate 503 is thermally coupled with the package 502 so that the cold plate 503 receives heat generated by the one or more semiconductor chips.

Liquid coolant is within the cold plate 503. If the system also employs air cooling (optional), a heat sink 504 can be thermally coupled to the cold plate 503. Warmed liquid coolant and/or vapor 505 leaves the cold plate 503 to be cooled by one or more items of cooling equipment (e.g., heat exchanger(s), radiator(s), condenser(s), refrigeration unit(s), etc.) and pumped by one or more items of pumping equipment (e.g., dynamic (e.g., centrifugal), positive displacement (e.g., rotary, reciprocating, etc.)) 506. Cooled liquid 507 then enters the cold plate 503 and the process repeats.

With respect to the cooling equipment and pumping equipment 506, cooling activity can precede pumping activity, pumping activity can precede cooling activity, or multiple stages of one or both of pumping and cooling can be intermixed (e.g., in order of flow: a first cooling stage, a first pumping stage, a second cooling stage, a second pumping stage, etc.) and/or other combinations of cooling activity and pumping activity can take place.

Moreover, the intake of any equipment of the cooling equipment and pumping equipment 506 can be supplied by the cold plate of one semiconductor chip package or the respective cold plate(s) of multiple semiconductor chip packages.

In the case of the later (intake received from cold plate(s) of multiple semiconductor chip packages), the semiconductor chip packages can be components on a same electronic circuit board or multiple electronic circuit boards. In the case of the later (multiple electronic circuit boards), the multiple electronic circuit boards can be components of a same electronic system (e.g., different boards in a same server computer) or different electronic systems (e.g., electronic circuit boards from different server computers). In essence, the general depiction of FIG. 5 describes compact cooling systems (e.g., a cooling system contained within a single electronic system), expansive cooling systems (e.g., cooling systems that cool the components of any of a rack, multiple racks, a data center, etc.) and cooling systems in between.

The above discussion focused on standard liquid cooling with a cold plate. For vapor cooling, the cold plate is replaced with a vapor chamber 503. The vapor chamber can emit vapor 505 which is condensed to liquid by the cooling equipment 506. Cooled liquid 507 is then pumped back into the vapor chamber 503. In another approach the vapor chamber 503 is sealed and is thermally coupled to a cold plate which operates according to standard liquid cooling as described above.

Any of a heat sink, cold plate, and vapor chamber can be referred to more generally as a cooling mass.

Figure 6:
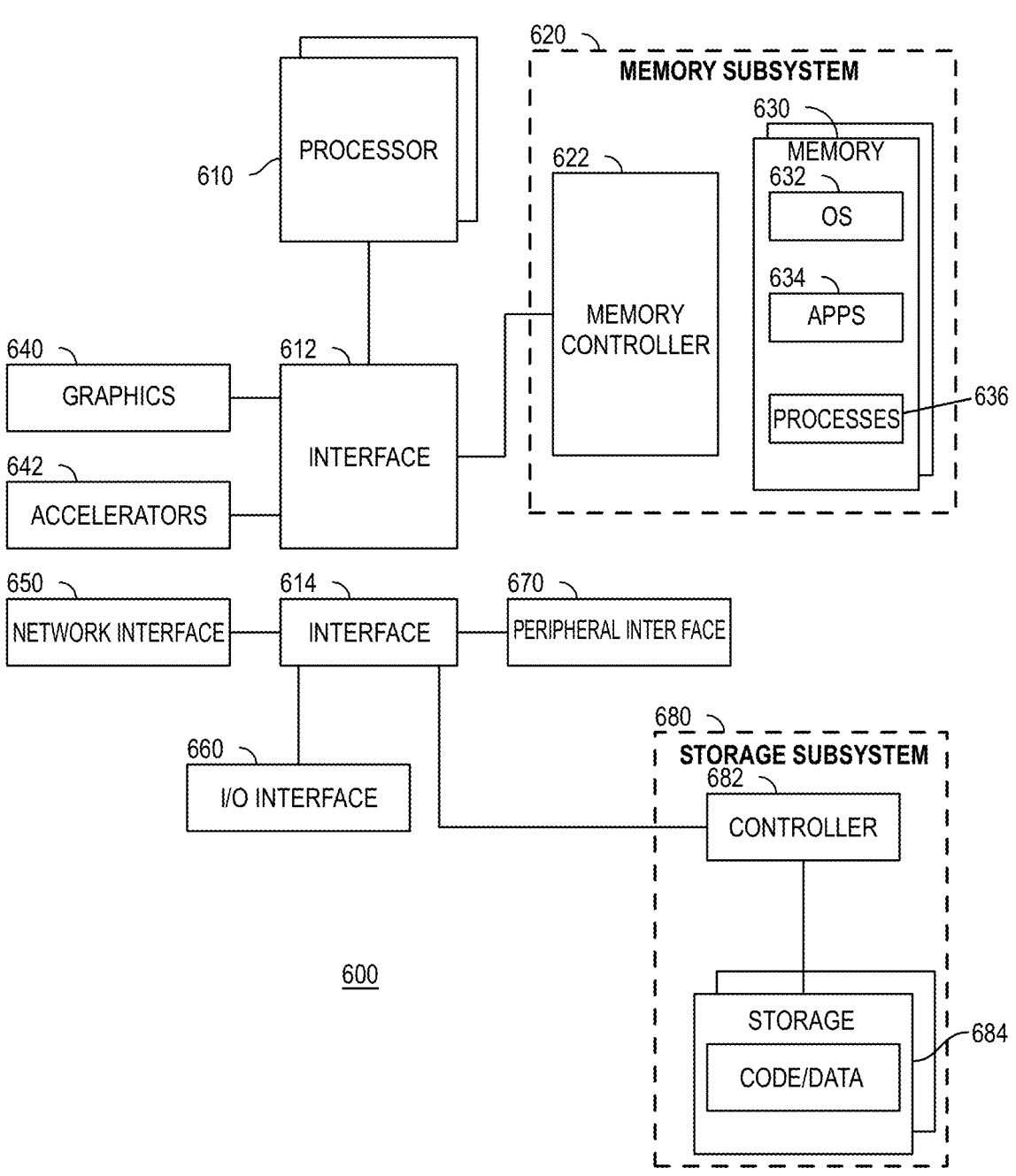
FIG. 6 shows a system.
Figure 7:
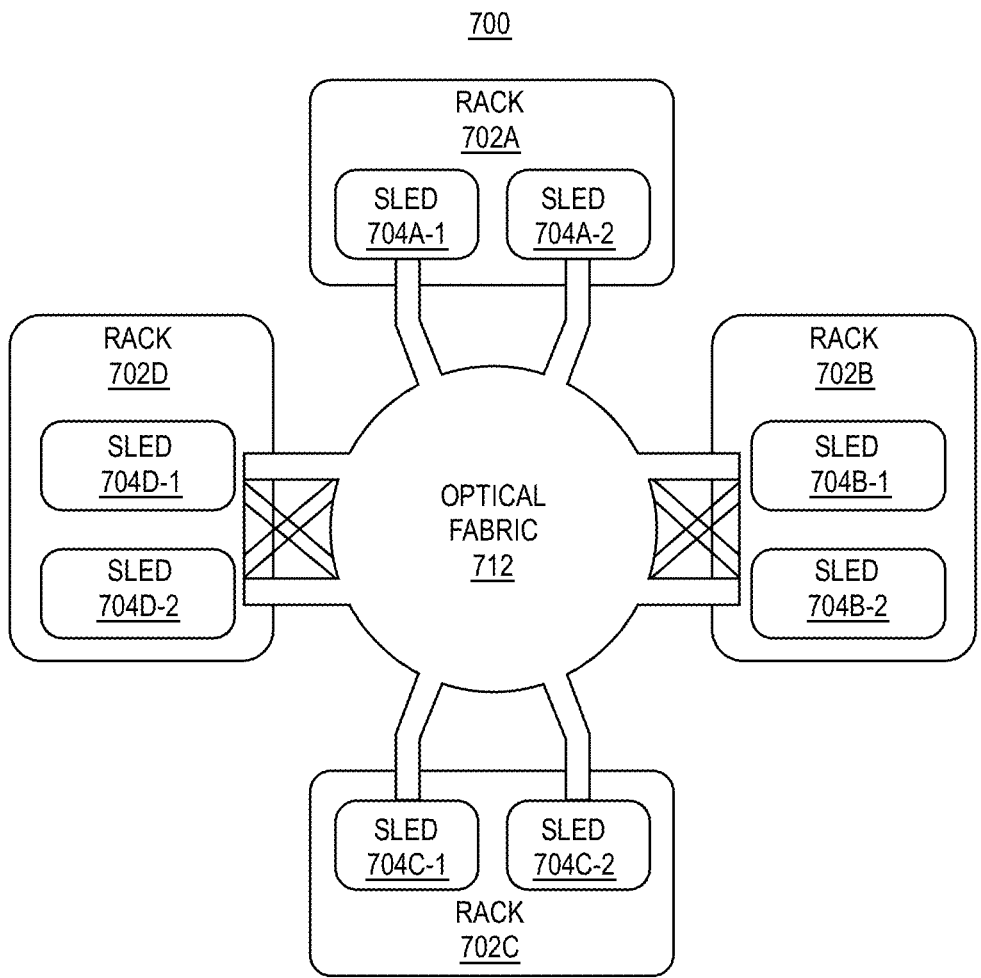
FIG. 7 shows a data center.
Figure 8:
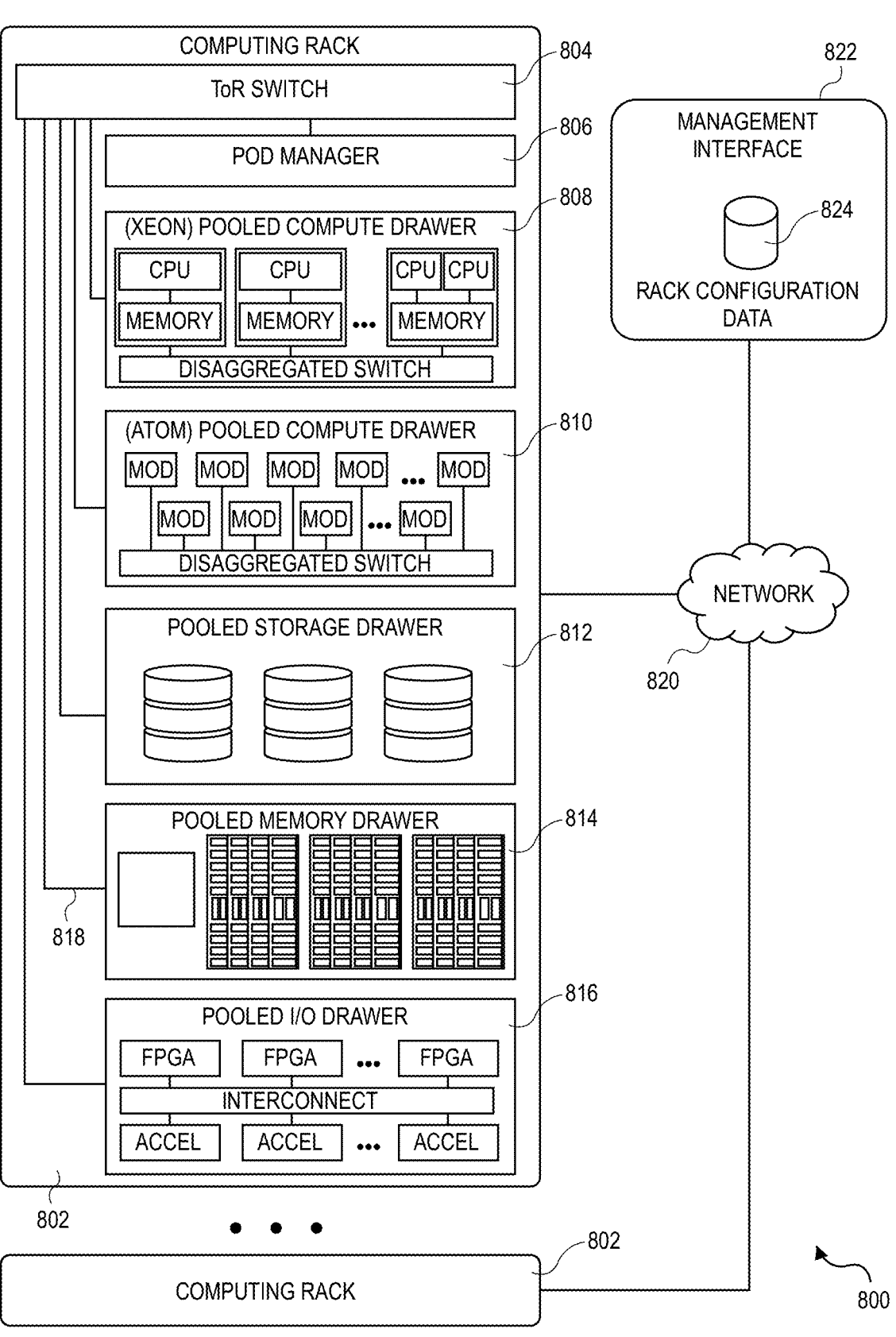
FIG. 8 shows a rack.

The following discussion concerning FIGS. 6, 7 and 8 are directed to systems, data centers and rack implementations, generally. As such, FIG. 6 generally describes possible features of an electronic system that can include one or more semiconductor chip packages having a cooling assembly that is designed according to the teachings above. FIG. 7 describes possible features of a data center that include such electronic systems. FIG. 8 describes possible features of a rack having one or more such electronic systems installed into it.

FIG. 6 depicts an example system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software functionality to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Such non-volatile memory devices can be placed on a DIMM and cooled according to the teachings above.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented as a disaggregated computing system. For example, the system 600 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 6, other types of systems to which the above described invention can be applied and are also partially or wholly described by FIG. 6 are communication systems such as routers, switches and base stations.

FIG. 7 depicts an example of a data center. Various embodiments can be used in or with the data center of FIG. 7. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) the other sleds in data center 700. However, optical, wireless, and/or electrical signals can be transmitted using fabric 712. The signaling connectivity that optical fabric 712 provides to any given sled may include connectivity both to other sleds in a same rack and sleds in other racks.

Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 712 can provide optical and/or electrical signaling.

FIG. 8 depicts an environment 800 that includes multiple computing racks 802, each including a Top of Rack (ToR) switch 804, a pod manager 806, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 808, and INTEL® ATOM™ pooled compute drawer 810, a pooled storage drawer 812, a pooled memory drawer 814, and a pooled I/O drawer 816. Each of the pooled system drawers is connected to ToR switch 804 via a high-speed link 818, such as a 40 Gigabit/second (Gb/s) or 100 Gb/s Ethernet link or an 100+Gb/s Silicon Photonics (SiPh) optical link. In one embodiment high-speed link 818 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 800 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations. RSD environment 800 further includes a management interface 822 that is used to manage various aspects of the RSD environment. This includes managing rack configuration, with corresponding parameters stored as rack configuration data 824.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. A semiconductor chip package assembly comprising:
a cooling mass;
a bolster plate at least partially around a semiconductor chip package;
a spring to be coupled between a base of the cooling mass and the bolster plate to apply a loading force that pulls the base and the bolster plate toward each other in the assembly's nominal assembled state; and
a rectangular block of viscous material to reduce an oscillation amplitude of the cooling mass, the rectangular block having a first end in contact with the base and a second end, opposite the first end, in contact with the bolster plate, the rectangular block spaced apart from the semiconductor chip package.

2. The semiconductor chip package assembly of claim 1 wherein the cooling mass includes a heat sink.

3. The semiconductor chip package assembly of claim 1 wherein the cooling mass includes a cold plate.

4. The semiconductor chip package assembly of claim 1 wherein the cooling mass includes a vapor chamber.

5. The semiconductor chip package assembly of claim 1 wherein the dampener rectangular block is one of a plurality of dampeners that are outside a periphery of a semiconductor chip package socket.

6. A semiconductor chip package assembly comprising:
a cooling mass;
a bolster plate at least partially around a semiconductor chip package;
a spring between a base of the cooling mass and the bolster plate to apply a loading force that pulls the base and the bolster plate toward each other in a nominal assembled state of the semiconductor chip package assembly; and
a first dampener to reduce an amplitude of oscillation of the cooling mass, the first dampener having a first end in contact with the base and a second end, opposite the first end, the second end in contact with the bolster plate, the first dampener spaced apart from the semiconductor chip package, the first dampener secured to one of the base and the bolster plate; and
a second dampener secured to the other but not the one of the base and the bolster plate.

7. An apparatus, comprising:
a printed circuit board;
a socket mounted to the printed circuit board;
a semiconductor chip package within the socket;
a back plate;
a bolster plate mounted to the back plate, the printed circuit board between the back plate and the bolster plate, the bolster plate at least partially around the semiconductor chip package;
a cooling mass having a base mounted to the bolster plate with a spring that applies a loading force to the base of the cooling mass and the bolster plate that pulls the base of the cooling mass and the bolster plate toward one another; and
a dampener between the base of the cooling mass and the bolster plate that is coupled to at least one of the base of the cooling mass and the bolster plate to reduce oscillation amplitude of the cooling mass, the dampener having a first end in contact with the base and a second end, opposite the first end, in contact with the bolster plate, the dampener spaced apart from the semiconductor chip package.

8. The apparatus of claim 7 wherein the cooling mass is a heat sink.

9. The apparatus of claim 7 wherein the cooling mass is a cold plate.

10. The apparatus of claim 7 wherein the cooling mass is a vapor chamber.

11. The apparatus of claim 7 wherein the dampener is one of a plurality of dampeners that are outside a periphery of the socket.

12. The apparatus of claim 7 wherein the dampener is a first dampener, the first dampener coupled to one of the base and the bolster plate, the apparatus including a second dampener that is coupled to the other but not the one of the base of the cooling mass and the bolster plate.

13. A data center, comprising:
a plurality of computing systems that are mechanically integrated into a plurality of racks, the plurality of computing systems communicatively coupled by one or more networks, a computing system of the plurality of computing systems including the apparatus of claim 7.

14. The semiconductor chip package assembly of claim 1, wherein the rectangular block is epoxied to the base and the bolster plate.

15. The apparatus of claim 7, wherein the dampener includes a viscous material.

16. The apparatus of claim 7, wherein the dampener includes at least one of a rectangular block of viscous material or a cylindrical block of viscous material.

17. The apparatus of claim 7, wherein the dampener is epoxied to the base and the bolster plate.

18. The apparatus of claim 7, wherein the dampener is one of at least two dampeners, the at least two dampeners diagonally from each other on opposite sides of the semiconductor chip package.

* * * * *